(12) United States Patent
Fujiwara

(10) Patent No.: US 6,301,155 B1
(45) Date of Patent: Oct. 9, 2001

(54) NON-VOLATILE SEMICONDUCTOR MEMORY DEVICE AND METHOD OF READING SAME

(75) Inventor: Ichiro Fujiwara, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/664,167

(22) Filed: Sep. 18, 2000

(30) Foreign Application Priority Data

Sep. 17, 1999 (JP) .................................................. 11-264505

(51) Int. Cl.[7] ....................................................... G11C 7/00
(52) U.S. Cl. ................ 365/185.18; 365/185.02; 365/185.28; 365/185.01
(58) Field of Search ................. 365/185.01, 185.02, 365/185.18, 185.28, 185.33

(56) References Cited

U.S. PATENT DOCUMENTS

| | | | | |
|---|---|---|---|---|
| 5,581,500 | * | 12/1996 | D'Souza ................................. | 365/154 |
| 5,583,821 | * | 12/1996 | Rose et al. ............................. | 365/226 |
| 5,734,604 | * | 3/1998 | Akamatsu et al. ..................... | 365/156 |
| 5,764,566 | * | 6/1998 | Akamatsu et al. ..................... | 365/156 |
| 6,005,801 | * | 12/1999 | Wu et al. ............................... | 365/175 |
| 6,188,628 | * | 2/2001 | Tomotani ............................... | 365/226 |
| 6,208,567 | * | 3/2001 | Yamauchi et al. ..................... | 365/200 |

* cited by examiner

*Primary Examiner*—Viet Q. Nguyen
(74) *Attorney, Agent, or Firm*—Sonnenschein, Nath & Rosenthal

(57) ABSTRACT

A non-volatile semiconductor memory device for reducing an off-leakage current of non-selected memory transistors without reducing a read current of a selected memory transistor, having a plurality of memory transistors, each comprising a source region and a drain region formed sandwiching a channel-forming region at a surface portion of a semiconductor, a gate insulating film provided on the channel-forming region and including therein a charge storing means, and a gate electrode on the gate insulating film, arranged in a word direction and a bit direction, and a forward bias voltage supply means for supplying a forward bias voltage of a value to reduce an off-leakage current in the forward bias direction with respect to the channel-forming region to the gate electrodes of non-selected memory transistors among the above plurality of memory transistors at the time of a read operation.

28 Claims, 12 Drawing Sheets

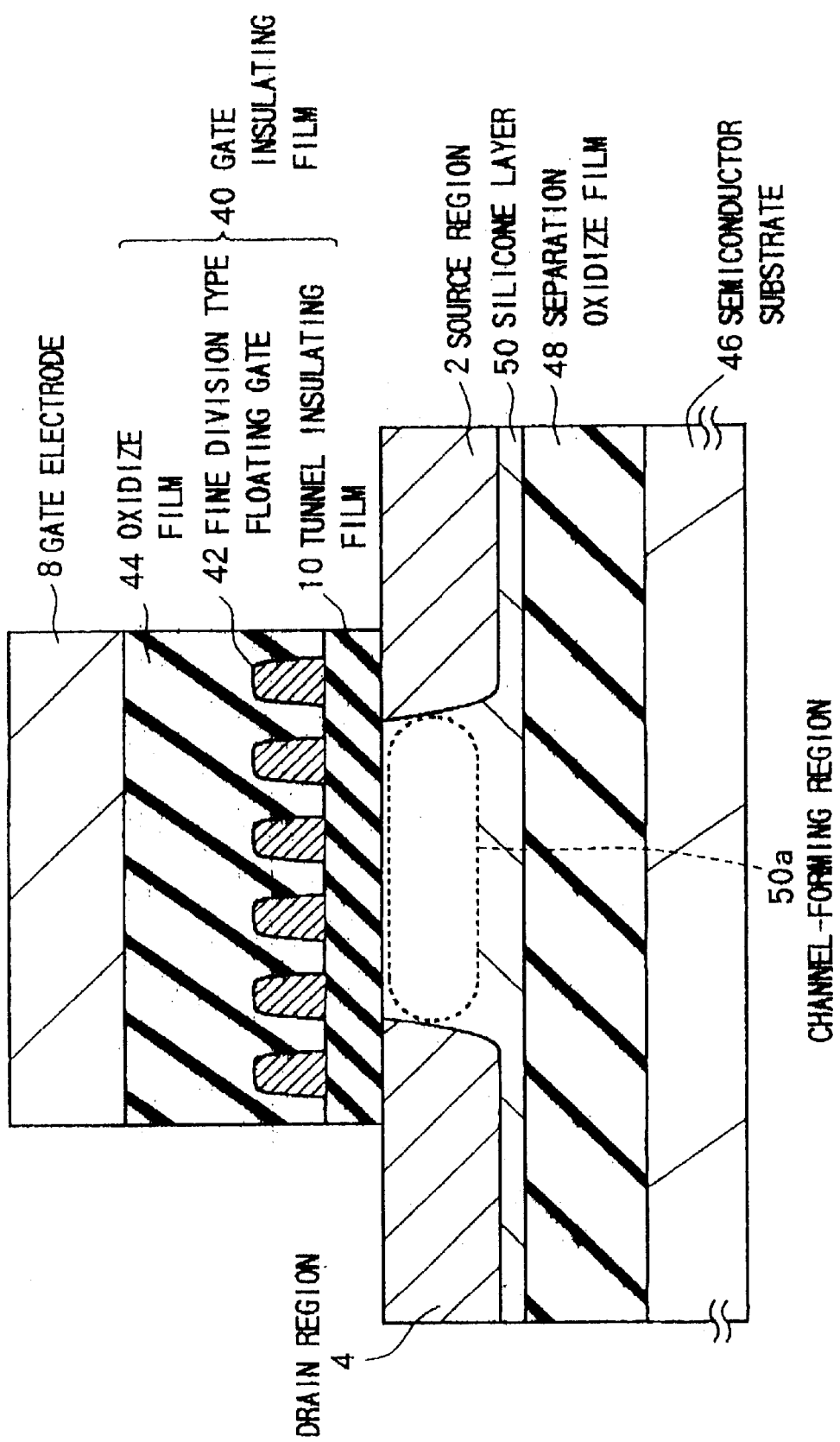

NON-VOLATILE SEMICONDUCTOR MEMORY DEVICE AND METHOD OF READING SAME

RELATED APPLICATION DATA

The present application claims priority to Japanese Application No. P11-264505 filed Sep. 17, 1999, which application is incorporated herein by reference to the extent permitted by law.

BACKGROUND OF THE INVENTION

1. Field of the Invention

The present invention relates to a non-volatile semiconductor memory device having a charge storing means (for example, a floating gate in a floating gate (FG) type, a charge trap in a nitride film in a metal-oxide-nitride-oxide-semiconductor (MONOS) type and metal-nitride-oxide-semiconductor (MNOS) type, a charge trap near the interface between a top insulating film and a nitride film, or fine particle conductor, etc.) inside a gate insulating film between a channel-forming region and a gate electrode of a memory transistor and performing as basic operations the electrical injection of charges (electrons or holes) in the charge storing means for storing or withdrawing of the same from the same and a method of reading the same.

2. Description of the Related Art

Non-volatile semiconductor memories include, for example, the FG type wherein charge storing means (floating gate) for holding charges is made planarly and, also, the MONOS type wherein charge storing means (charge traps) are made planarly dispersed.

In an FG type non-volatile memory transistor, a floating gate comprised of polycrystalline silicon etc. is stacked on a channel-forming region of a semiconductor via a gate insulating film. A control gate is further stacked on the floating gate via an inter-gate insulating film comprised of an oxide-nitride-oxide (ONO) film etc.

On the other hand, in a MONOS type non-volatile memory transistor, a tunnel insulating film comprised for example of a silicon oxide film, an oxynitride film, etc., an interlayer insulating film comprised of a nitride film, an oxynitride film, etc., and a top insulating film comprised of a silicon oxide film are successively stacked on the channel-forming region of the semiconductor. A gate electrode is formed on the top insulating film.

In a MONOS type non-volatile semiconductor memory, carrier traps serving mainly for holding charges in the nitride film ($Si_xN_y$ ($0<x<1$, $0<y<1$)) or at an interface between the top insulating film and the nitride film are discretely dispersed spatially (that is, in the planar direction and film thickness direction), so the charge holding characteristic depends on the energy and spatial distribution of the charge captured by the carrier trap in the $Si_xN_y$ film in addition to the tunnel insulating film thickness.

When a leakage current path locally occurs in the tunnel insulating film, in the FG type, much of the charge passes through the leakage path and the charge holding characteristic is liable to decline, while in the MONOS type, since the charge storing means are spatially dispersed, the local charges around the leakage path pass through the leakage path and only locally leaks and therefore the charge holding characteristic of the overall memory device is resistant to decline.

Therefore, in the MONOS type, the problem of the decline of the charge holding characteristic caused by a tunnel insulating film becoming thinner is not as serious as in the FG type. Accordingly, the MONOS type is superior to the FG type in scaling of the tunnel oxide film in a fine memory transistor having an extremely short gate length.

In the above FG type non-volatile memory or MONOS type or other non-volatile memory where the charge storing means of the memory transistors are planarly dispersed, to reduce the cost per bit, increase the integration, and realize a large scale non-volatile memory, it is essential to realize a one-transistor type cell structure.

However, particularly in a MONOS type or other non-volatile memory, the mainstream is a two-transistor type wherein a selection transistor is connected to a memory transistor. Various studies are currently underway for establishing the one-transistor cell technique.

To establish the one-transistor cell technique, improvement of the disturb characteristic is necessary in addition to optimization of the element structure such as the gate insulating film including the charge storing means and improvement of the reliability. As one means for improving the disturb characteristic of a MONOS type non-volatile memory, studies are being conducted to set the tunnel insulating film thicker than the normal film thickness of 1.6 nm to 2.0 nm.

In a one-transistor cell, since there is no selection transistor in the cell, it is important to reduce the disturb characteristic of the memory transistor in non-selected cells connected to the same common line as a cell to be written in. The technique has already been proposed of applying an inhibit voltage to a source impurity region or drain impurity region of a non-selected memory transistor via a bit line or a source line at the time of writing or reading and thereby preventing erroneous writing and erroneous erasure of the non-selected memory transistor.

Also, in order to realize a NOR type one-transistor cell using a MONOS type memory transistor, it is necessary to sufficiently reduce the leakage current from memory transistors of non-selected cells in the erase state when controlling the threshold voltage. The leakage current may be reduced by just making the effective value of the threshold voltage higher seen from a well at the time of a read operation. From this viewpoint, the so-called source bias reading technique of supplying for example a positive voltage to the source line connected to the selected transistor has been proposed.

Summarizing the problems to be solved by the invention, when using the source bias reading technique in a NOR-type cell array, the threshold voltage of the memory transistor, based on the well potential, becomes higher regardless of whether the cell is a non-selected cell or selected cell. The rise of the threshold voltage has the advantage of reducing the leakage current for a non-selected cell.

At the same time, however, since the threshold voltage of the memory transistor of the selected cell also rises, there is the disadvantage that the read current from the selected cell falls when the reading gate voltage is constant.

The problem of the reduction of the read current is liable to become greater along with the increasing integration and miniaturization of memory cells.

If the number of cells connected to the same bit line increases as the memory cells become more highly integrated, the cumulative amount of the off-leakage currents from the non-selected cells increases. If the read current falls at this time, the noise margin of the read current abruptly falls and the possibility of erroneous operation rapidly rises.

Also, even if the number of cells connected to the same bit line is the same, when the gate length of the memory transistor is scaled for the purpose of making the cell smaller, the off-leakage current increases, so as similar situation arises.

SUMMARY OF THE INVENTION

An object of the present invention is to provide a non-volatile semiconductor memory device configured to be able to reduce an off-leakage current of a non-selected memory transistor without lowering a read current of a selected memory transistor and a method of reading the same.

According to a first aspect of the present invention, there is provided a non-volatile semiconductor device comprised of a plurality of memory transistors, each comprising a source region and a drain region formed sandwiching a channel-forming region at a surface portion of a semiconductor, a gate insulating film provided on the channel-forming region and including therein a charge storing means, and a gate electrode on the gate insulating film, arranged in a word direction and a bit direction, further comprising a forward bias voltage supply means for supplying a forward bias voltage of a value to reduce an off-leakage current in the forward bias direction with respect to the channel-forming region to the gate electrodes of non-selected memory transistors among the above plurality of memory transistors at the time of a read operation.

According to a second aspect of the present invention, there is provided a method of reading a nonvolatile semiconductor memory device comprised of a plurality of memory transistors, each comprising a source region and a drain region formed sandwiching a channel-forming region at a surface portion of a semiconductor, a gate insulating film provided on the channel-forming region and including therein a charge storing means, and a gate electrode on the gate insulating film, arranged in a word direction and a bit direction; comprising supplying to the gate electrodes of non-selected memory transistors among the above plurality of memory transistors a forward bias voltage of a value to reduce an off-leakage current in the forward bias direction with respect to the channel-forming region at the time of a read operation.

Preferably, the forward bias voltage is set within a voltage region where said non-selected memory transistors are not read erroneously.

Preferably, the absolute value of said forward bias voltage is not more than 1V.

Preferably, a gate length of said memory transistor is not more than 0.13 $\mu$m.

Further, preferably, the memory transistor has a threshold voltage of at least 0V in its erase state.

A method of reading according to the present invention can be provided along with a so-called source-bias reading method of the related art.

In this case, a non-volatile semiconductor memory device according to the present invention further comprising a reverse bias voltage supply means for supplying a reverse bias voltage to reversely bias said source regions of non-selected memory transistors with respect to said channel-forming region at the time of a read operation.

The present invention is preferably a separated source line NOR type or NOR type non-volatile memory device with source lines and bit lines classified into a hierarchy.

Also, regarding the memory transistor structure, the present invention is particularly preferable for a MONOS type, fine particle type having small particle conductors like nanocrystals, and other non-volatile memory transistors wherein the charge storing means are planarly dispersed at least in a surface direction facing the above channel-forming region. This is because a nonvolatile memory transistor with planarly dispersed charge storing means excels in scaling of a tunnel insulating film compared with the FG type and is suited for miniaturization and higher integration.

Such a charge storing means does not have any conductivity over an entire surface direction facing the above channel-forming region when charges do not dissipate outside.

In a non-volatile semiconductor memory device configured as such, a drain read voltage is supplied to a selected bit line connected to a selected cell, while a gate read voltage is supplied to a selected word line, and a source line are kept at a ground potential.

As a result, the memory transistor of the selected cell turns on or off in accordance with whether the threshold voltage is in a write state or in a erase state. Namely, a transistor turns on when the threshold voltage is in a low level distribution (erase state) and a read current flows in a bit line. When the threshold voltage is in a high level distribution (write state), the transistor is in an off state and the read current does not flow in the bit line. Data is Judged by detecting a change of potential of the bit line due to the read current.

On the other hand, for non-selected cells, a forward bias voltage is supplied to the non-selected word lines by a forward bias voltage supply means at the time of a read operation. The forward bias voltage is set at a negative voltage of for example −0.1 to −0.5V (to an extent lower than −1.0V at maximum) when the memory transistor is an n-type channel.

Generally, when the gate length of the memory transistor is scaled to a certain extent, a punch-through current caused by application of a drain read voltage becomes predominant in an off-leakage current from the non-selected cells. The punch-through current arises mainly because the drain read voltage reduces the potential barrier height between the source and the substrate (or well).

In the non-volatile semiconductor device according to the present invention configured as explained above, the potential barrier height between the above source and the substrate (or well) is increased by biasing the potential of the non-selected word lines for example to the negative side a little. As a result, the off-leakage current from the non-selected cells, wherein a punch-through current is predominant, declines.

As explained above, in the present invention, since the off-leakage current is reduced by controlling the potentials of non-selected word lines, the read current does not decrease due to the rise of the threshold voltage of the selected cell.

Note that when the method of reading according to the present invention is used along with a source bias reading means of the related art, even an absolute value of the forward bias voltage to be applied to the non-selected cells are suppressed low while suppressing the decrease of the read current at a minimum to an extent not to cause erroneous reading, the off-leakage current sufficiently decreases by using the source bias reading method together. In this case, a read disturb margin of the non-selected cells expands by exactly the amount by which the absolute value of the forward bias voltage is kept low.

BRIEF DESCRIPTION OF THE DRAWINGS

These and other objects and features of the present invention will become clearer from the following description of the preferred embodiments given with reference to the accompanying drawings, in which:

FIG. 12 is a sectional view of an element structure of a fine divided FG type memory transistor according to a fourth embodiment of the present invention.

DESCRIPTION OF THE PREFERRED EMBODIMENTS

Below, preferred embodiments will be described with reference to the accompanying drawings.

First Embodiment

Figure 1:
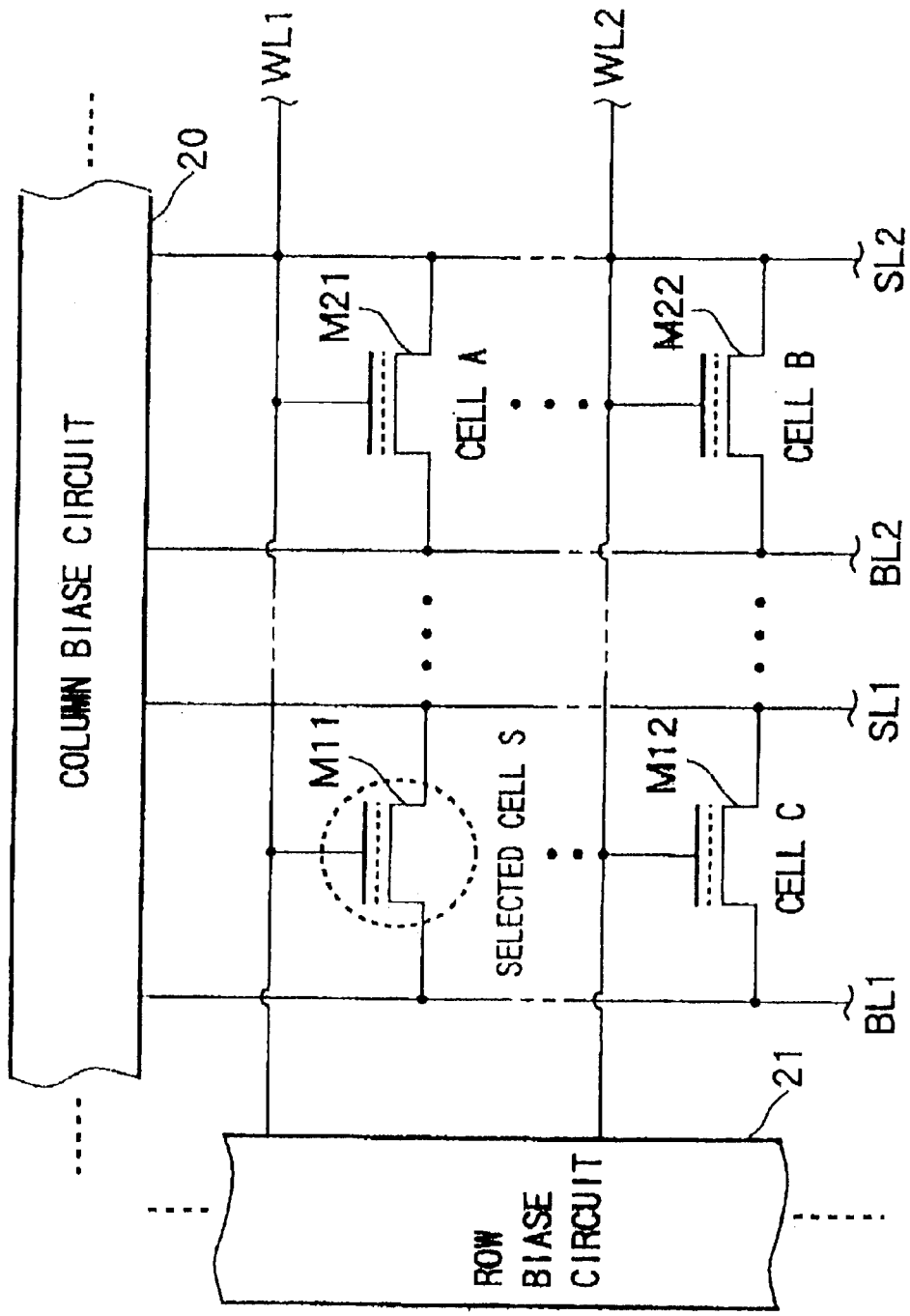
FIG. 1 is a view of the schematic configuration of a separated source line NOR type non-volatile semiconductor memory according to embodiments of the present invention.

FIG. 1 is a view of the schematic configuration of a separated source line NOR type non-volatile semiconductor memory according to embodiments of the present invention.

In a non-volatile memory device of the present embodiment, each memory cell of the NOR type memory cell array is comprised of one memory transistor. As shown in FIG. 1, memory transistors M11 to M22 are arranged in rows. The transistors are connected by word lines, bit lines, and separated type source lines.

Namely, the drains of the memory transistor M11 and M12 adjacent to each other in the bit direction are connected to a bit line BL1, while the sources are connected to a source line SL1. Similarly, the drains of the memory transistors M21 and M22 adjacent to each other in the bit direction are connected to a bit line BL2, while the sources are connected to a source line SL2.

Also, the gates of the memory transistors M11 and M21 adjacent in the word direction are connected to the word line WL1, while the gates of the memory transistors M12 and M22 adjacent in the word direction are connected to the word line WL2 in the same way.

In the memory cell array as a whole, cells are arranged and cells are connected repeatedly in this way.

A non-volatile semiconductor memory device according to the present embodiment comprises a column bias circuit 20 and a row bias circuit 21 as a means of decreasing a leakage current at the time of a read operation.

The row bias circuit 21 corresponds to the "forward bias voltage supply means" of the present invention and is connected to the word lines WL1, WL2, . . . The row bias circuit 21, as will be explained in detail later on, effectively decreases the leakage current of non-selected transistors by applying for example some negative voltage to the non-selected word lines at the time of a read operation. The column bias circuit 20 corresponds to the "reverse bias voltage supply means" of the present invention and is connected to all of the bit lines BL1, BL2, . . . and all of the source lines SL1, SL2, . . . in the illustrated example. The column bias circuit 20, as will be explained in detail later on, effectively decreases the leakage current of non-selected memory transistors connected to the same source line by applying for example some positive voltage to the source line in accordance with need at the time of a read operation.

Figure 2:
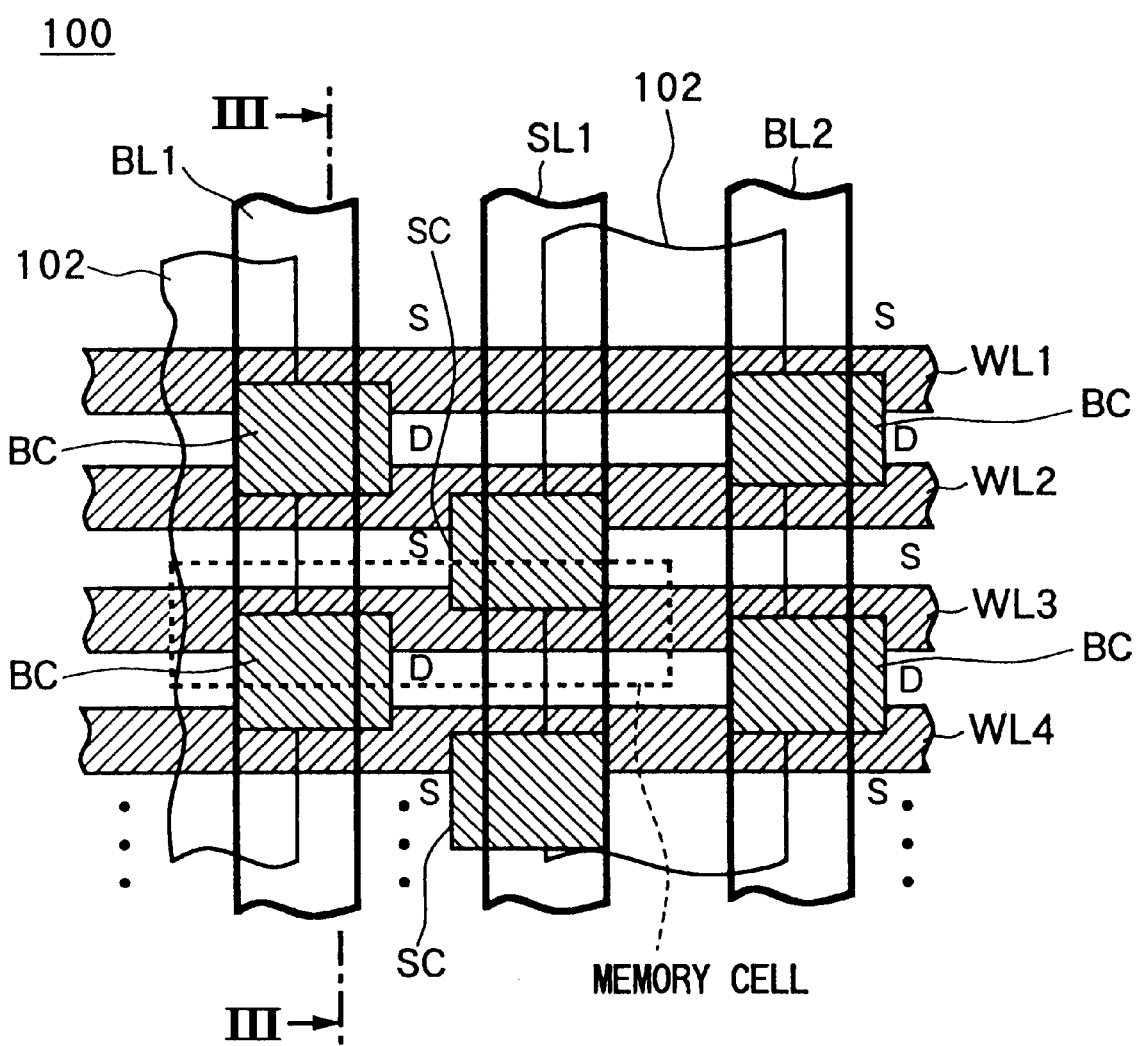
FIG. 2 is a schematic plan view of a miniature NOR type cell array using self-alignment as an example of a specific cell arrangement pattern according to a first embodiment of the present invention.
Figure 3:
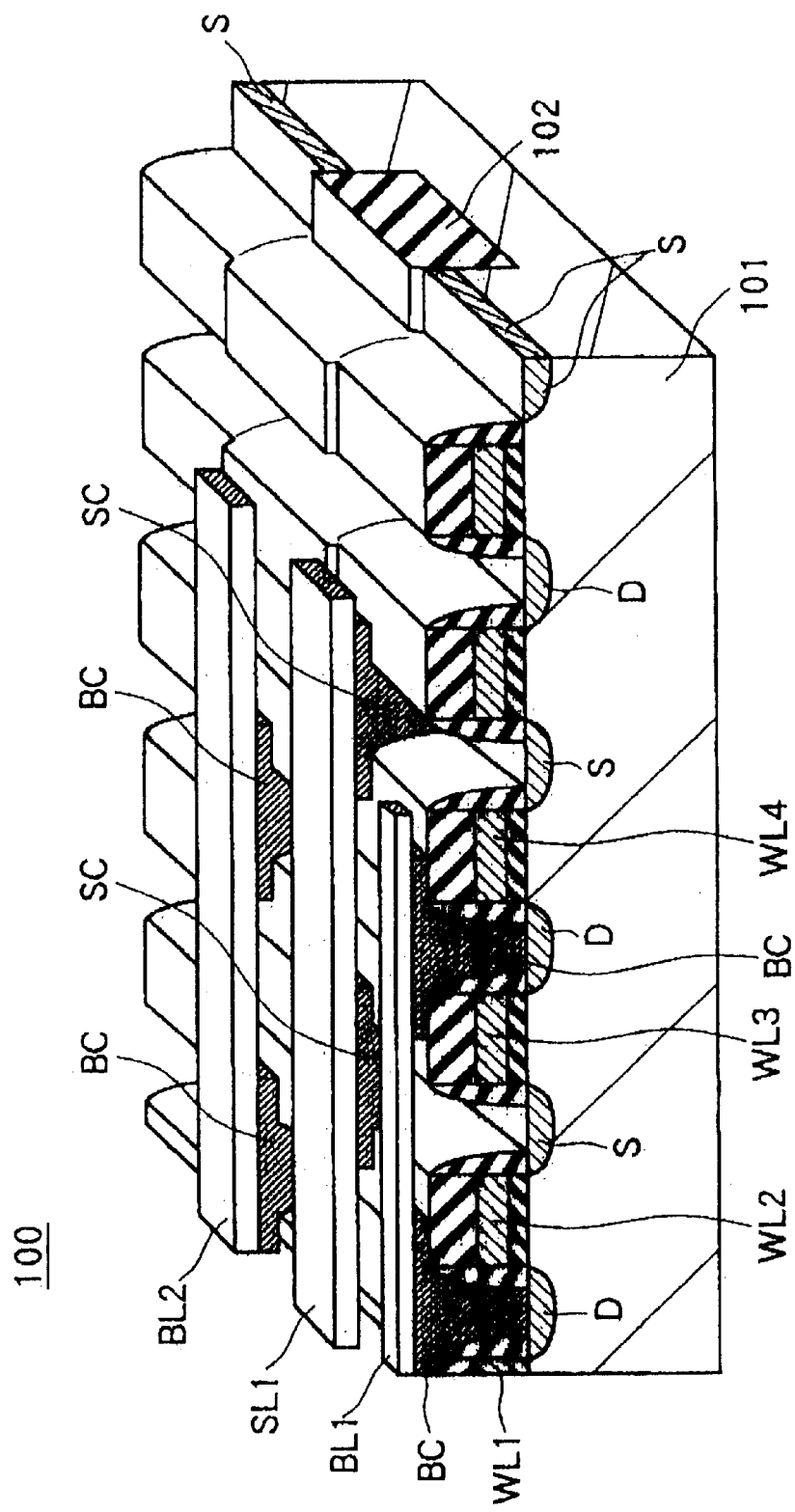
FIG. 3 is a bird's eye view seen from a cross-section taken along the line III-III in the cell array of FIG. 2 according to the first embodiment of the present invention.

FIG. 2 is a schematic plan view of a miniature NOR type cell array using self alignment as a specific example of a cell arrangement pattern. FIG. 3 is a bird's eye view seen from a cross-section taken along the line III-III in FIG. 2.

In the miniature NOR type cell array 100, as shown in FIG. 3, an element separation insulating layer 102 is formed by trenche or LOCOS etc. on the surface of an n-type or p-type semiconductor substrate 101 (n-well or p-well also possible). The element separation insulating layer 102 is, as shown in FIG. 2, arranged in long parallel stripes in the bit direction (longitudinal direction in FIG. 2). The word lines WL1, WL2, WL3, WL4, . . . are arranged at equal intervals substantially orthogonal to the element separation insulating layer 102. The word lines are, as will be explained later on, configured by stacking a gate insulating film comprised of a tunnel insulating film, nitride film, and top insulating film and a gate electrode.

In the active regions in the intervals of the element separation insulating layer 102, impurities of a conductivity type opposite to the substrate 101 are doped in a high concentration at the spaces between the word lines so as to alternately form source regions S and drain regions D. The source regions S and drain regions D are defined in size in the word direction (lateral direction in FIG. 2) by only the intervals between the trenches or the LOCOSs or other element separation insulating layers 102 and defined in the bit direction by only the intervals between word lines. Accordingly, the source regions S and the drain regions D are not affected much at all by errors in mask alignment relating to the variations of the size and arrangement, so they are formed extremely uniformly.

Upper portions and side walls of the word lines are covered with an insulating layer. Namely, offset insulating layers are arranged in the same pattern on the word lines WL1, WL2, . . . , while side-wall insulating layers are formed at the two side walls of a stacked pattern comprised of the offset insulating layer, the gate electrode (word lines) below that, and the gate insulating layer. Elongated self-aligned contacts are formed along the word lines at space portions between the word lines by the offset insulating layers and the sidewall insulating layers.

Conductive materials are buried alternately in the self aligning contacts so as to be partially overlapped the source regions S or drain regions D, thus bit contact plugs BC and source contact plugs SC are formed.

In forming the bit contact plugs BC and the source contact plugs SC, the conductive material is deposited so as to bury the entire self aligning contact region and a resist pattern for an etching mask is formed thereon. At this time, the resist pattern is made one size larger than the width of the self aligning contacts and partially superimposed on the element separation insulating layer. Further, the conductive material around the resist pattern is removed by etching using the resist pattern as a mask. As a result, the bit contact plugs BC and the source contact plugs SC are formed at the same time.

The concavities around the contacts are buried with a not shown insulating film.

On the insulating film, the bit lines BL1, BL2, . . . contacting the bit contact plugs BC and the source lines SL1, SL2, . . . contacting the source contact plugs SC are alternately formed in parallel stripes.

In the miniature NOR type cell array 100, contacts are formed on the bit lines and the source lines by self alignment contact formation and plug formation. Insulation and separation of the word lines are attained by forming the self aligning contacts, and the exposed surfaces of the source regions S and the drain regions D are uniformly formed. The bit contact plugs BC and the source contact plugs SC are formed on the exposed surfaces of the source regions S or the drain regions D in the self aligning contacts. Accordingly, the substrate contacting surfaces of the plugs are mostly determined in size in the bit direction by the self alignment contact formation, so there is that much less variation in the contact areas.

Insulation and separation of the bit contact plugs BC or the source contact plugs SC and the word lines are easy. Namely, the offset insulating layers are formed all at once when forming the word lines, then the sidewall insulating layers are formed by just forming the insulating film and etching (etching back) the entire surface.

Also, since the bit contact plugs BC and the source contact plugs SC and further the bit lines and the source lines are formed by patterning the same layer of the conductive layer, the interconnection structure is extremely simple, the number of steps is small, and the structure is advantageous for suppressing the production costs.

Furthermore, since there is almost no wasted space, when forming the layers by the minimum line width F of the wafer processing limit, production is possible with a very small cell area close to $8F^2$.

Figure 4:
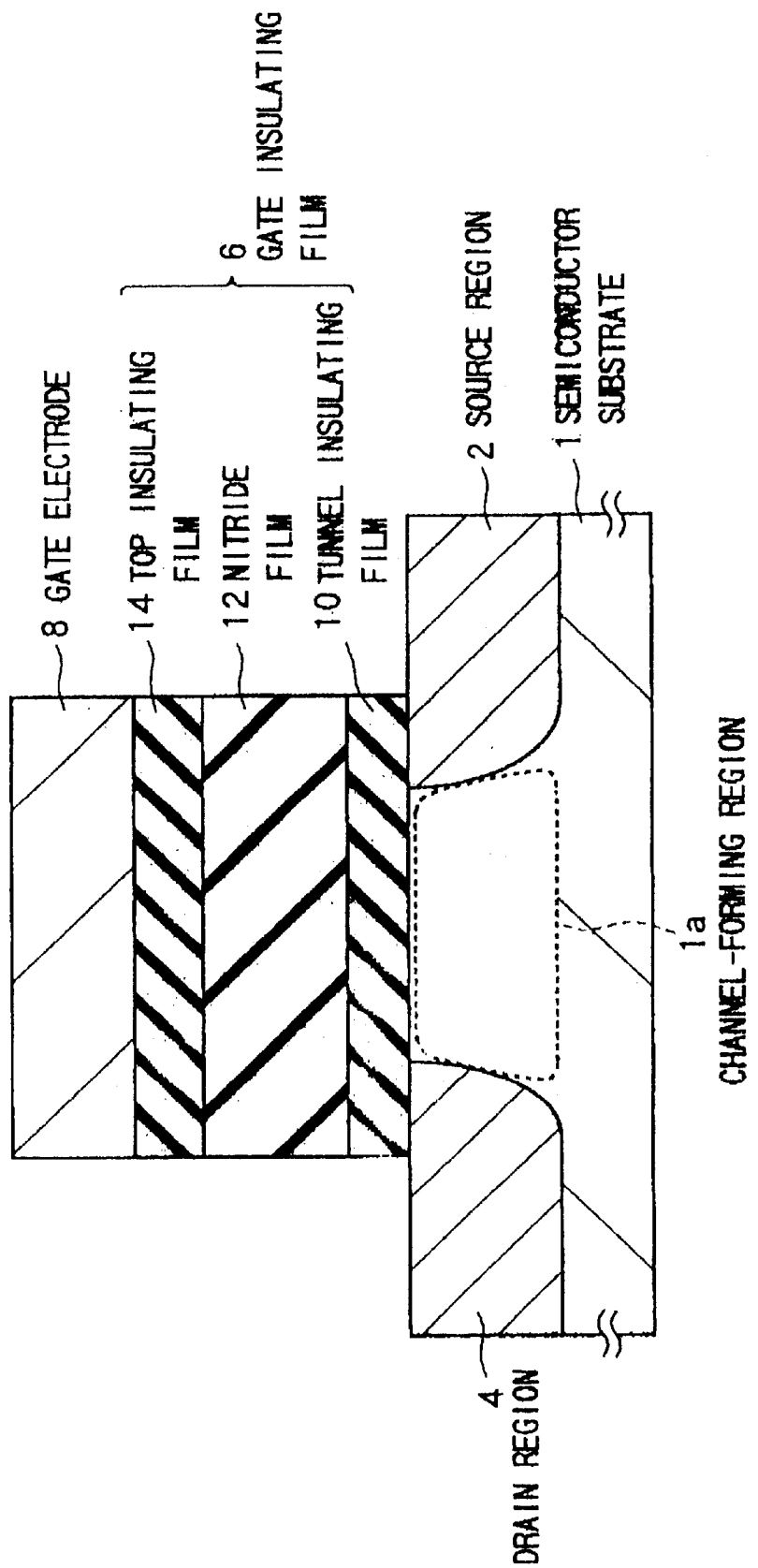
FIG. 4 is a sectional view of the element structure of a MONOS type memory transistor according to the first embodiment of the present invention.

FIG. 4 is a sectional view of the element structure of a MONOS type memory transistor according to the present embodiment.

In FIG. 4, reference numeral 1 indicates a silicon wafer or other semiconductor substrate or well having an n-type or p-type conductivity, 1a indicates a channel-forming region, and 2 and 4 indicate a source region and a drain region of the memory transistor.

The "channel-forming region" in the present invention refers to a region where a channel through which electrons or holes pass is formed inside the surface side. The "channel-forming region" in the present embodiment is a portion sandwiched by a source region 2 and drain region 4 in the semiconductor substrate or well 1.

The source region 2 and the drain region 4 are regions having a high conductivity formed by doping impurities of an opposite conductivity to the channel-forming region la at a high concentration into the semiconductor substrate 1. There are a variety of forms. Normally, a low concentration region called a lightly doped drain (LDD) is often provided at the position on the substrate surface facing the channel-forming region la of the source region 2 and the drain region 4.

A gate electrode 8 of the memory transistor is stacked via the gate insulating layer 6 on the channel-forming region la. The gate electrode 8 is generally comprised of polycrystalline silicon (doped poly-Si) made conductive by being doped with p-type or n-type impurities at a high concentration or stacked films of doped poly-Si and a refractory metal silicide. The length of the gate electrode 8 in the channel direction (gate length) is not more than 0.13 $\mu$m, for example, about 0.1 $\mu$m.

The gate insulating film 6 in the present embodiment is configured, in order from the lower layer, by a tunnel insulating film 10, a nitride film 12, and a top insulating film 14.

The tunnel Insulating film 10 may be a film of silicon oxide ($SiO_2$) formed by thermal oxidation, but in the present embodiment is comprised of an oxynitride film obtained by forming an oxide film by rapid thermal oxidation (RTO) and then processing this by rapid thermal nitridation (RTN). The thickness of the tunnel insulating film 10 may be determined In a range of 2.0 nm to 3.5 nm in accordance with the application of use. Here, it is set to 2.7 $\mu$m.

The nitride film 12 Is configured for example by a 5.0 nm silicon nitride ($Si_xN_y$ (0<x<1, 0<y<1)) film. The nitride film 12 is prepared for example by low pressure CVD (LP-CVD). A large number of carrier traps are included in the film. The nitride film 12 exhibits a Frenkel-Poole (FP) type electroconductive characteristic.

In the top insulating film 14, it is necessary to form deep carrier traps at a high density near the interface with the nitride film 12. For this purpose, for example it is formed by thermal oxidation of a formed nitride film 12. Also, the top insulating film 14 may be a $SiO_2$ film formed by a high temperature chemical vapor deposition oxide (HTO) method. When the top insulating film is formed by CVD, the traps are formed by heat treatment. The thickness of the top insulating film is required to be at least 3.0 nm, preferably not less than 3.5 nm, for effectively blocking injection of holes from the gate electrode 8 and preventing a decrease of the rewritable number of data.

In a non-volatile memory configured as above, when reading data from a selected cell S in FIG. 1, a gate read voltage of 1.5 to 2.0V is supplied to the word line WL1 and a drain read voltage of 1.0 to 1.5V is supplied to the selected bit line BL1. At this time, the non-selected bit lines BL2 . . . are held at 0V.

In the present embodiment, a "forward bias voltage" is supplied to the non-selected word lines WL2, . . . The forward bias voltage is a voltage becoming a forward direction with respect to the channel-forming region. Its absolute value is small enough to reduce the off-leakage voltage. Here, the "voltage becoming a forward direction with respect to the channel-forming region" indicates a voltage wherein the voltage supply direction based on the potential of the channel-forming region becomes the forward direction by assuming a pn-junction. Specifically, for example, in FIG. 4, the voltage is a negative voltage when the channel-forming region la is the p-type and held at the ground potential. Conversely, the voltage is a positive voltage when the channel-forming region 1a is the n-type and held at the ground potential. The voltage becoming the forward direction with respect to the channel-forming region is preferably not more than 1V as an absolute value. This is for preventing erroneous writing and erroneous erasure by decreasing the disturb characteristic of the non-selected memory transistors at the time of a read operation.

Also, in accordance with need, a "reverse bias voltage" is supplied to the source line SL1 to which the selected memory cell is connected. Here, the reverse bias voltage indicates a voltage for reversely biasing the pn-junction between the source region and the channel-forming region. Specifically, for example in FIG. 4, when the channel-forming region 1a is the p-type and held at the ground potential, the voltage to be supplied to the source region 2 is a positive voltage. Conversely, when the channel-forming region 1a is the n-type and held at the ground potential, the voltage to be supplied to the source region 2 is a negative voltage. Though the application of a reverse bias voltage is not necessary in the present invention, the strength of the forward bias voltage (absolute value) can be reduced by applying a reverse bias voltage, and the margin of safety for the read disturb characteristic can be expanded. Note that when the reverse bias voltage is excessively supplied, the read current of the selected memory transistor is abruptly reduced, thus there is an optimal range in the relation with the forward bias voltage.

Depending on the above bias application method, the on/off state of the selected memory transistor is determined in accordance with the logic of the held data of the selected cell. A read current flows to the selected bit lines BL1 when the selected memory transistor is on. The existence of a read current is judged by amplification by a not shown sense amplifier.

In a NOR type memory cell array where the memory transistors are miniaturized, the leakage current (off leakage current) from non-selected cells at the time of a read operation is mainly caused by punch-through between a source and drain in a transistor. As explained above, when the gate length of the memory transistor is made less than 0.13 $\mu$m, even if the drain read voltage is scaled to around 1.0 to 1.5V, a depletion layer extends from the drain side to the source side by the supply of voltage and the drain voltage effectively reduces the potential between the source and the substrate or well. This is called the drain-induced barrier lowering (DIBL) effect. Due to this effect, the punch-through current is increased.

In a method of reading according to the present embodiment, by supplying a forward bias voltage to the gate as explained above, the punch-through current is suppressed. This is because application of a negative voltage to a gate in the case of an n-channel MOSFET acts to return the source potential barrier height, reduced by the DIBL effect, to its original level.

Figure 5:
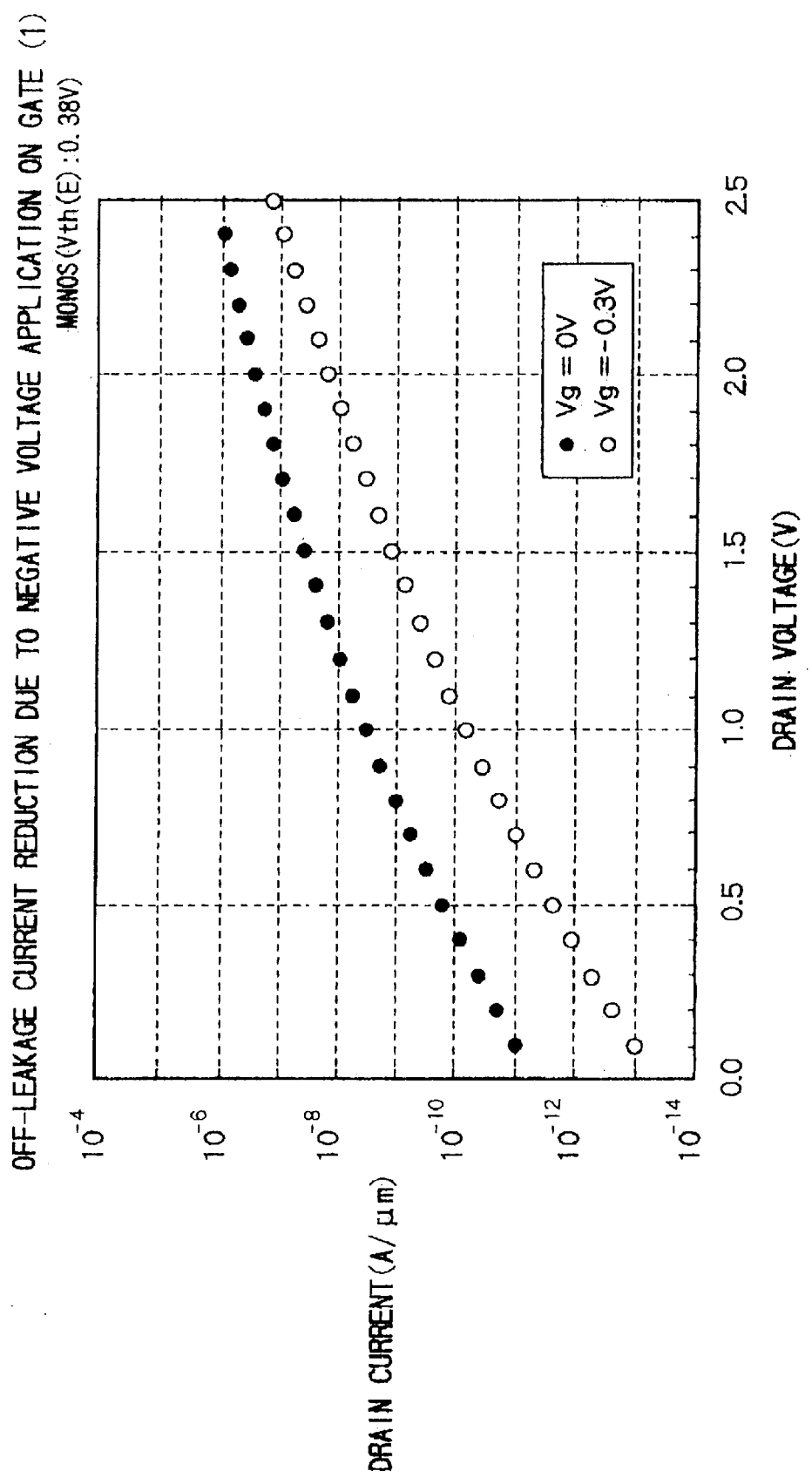
FIG. 5 is a graph of the drain voltage-current characteristic measured by changing a gate voltage in a MONOS type memory transistor according to the first embodiment of the present invention.

FIG. 5 shows the leak-current characteristic of a MONOS transistor having a threshold voltage Vth(E) in an erase state of 0.38V at a gate voltage Vg of 0V and −0.3V.

As expected, the leakage current at the time of supplying a negative bias voltage of Vg=−0.3V to a gate is improved compare with the case without biasing (Vg=0V). Also, the leakage current at the time when the drain read voltage is 1.2V is not more than 10 nA/$\mu$m. At this time, since the read current is 50 $\mu$A/$\mu$m or more, detection by a sense amplifier is sufficiently possible even if the number of cells in the bit direction is large.

Figure 6:
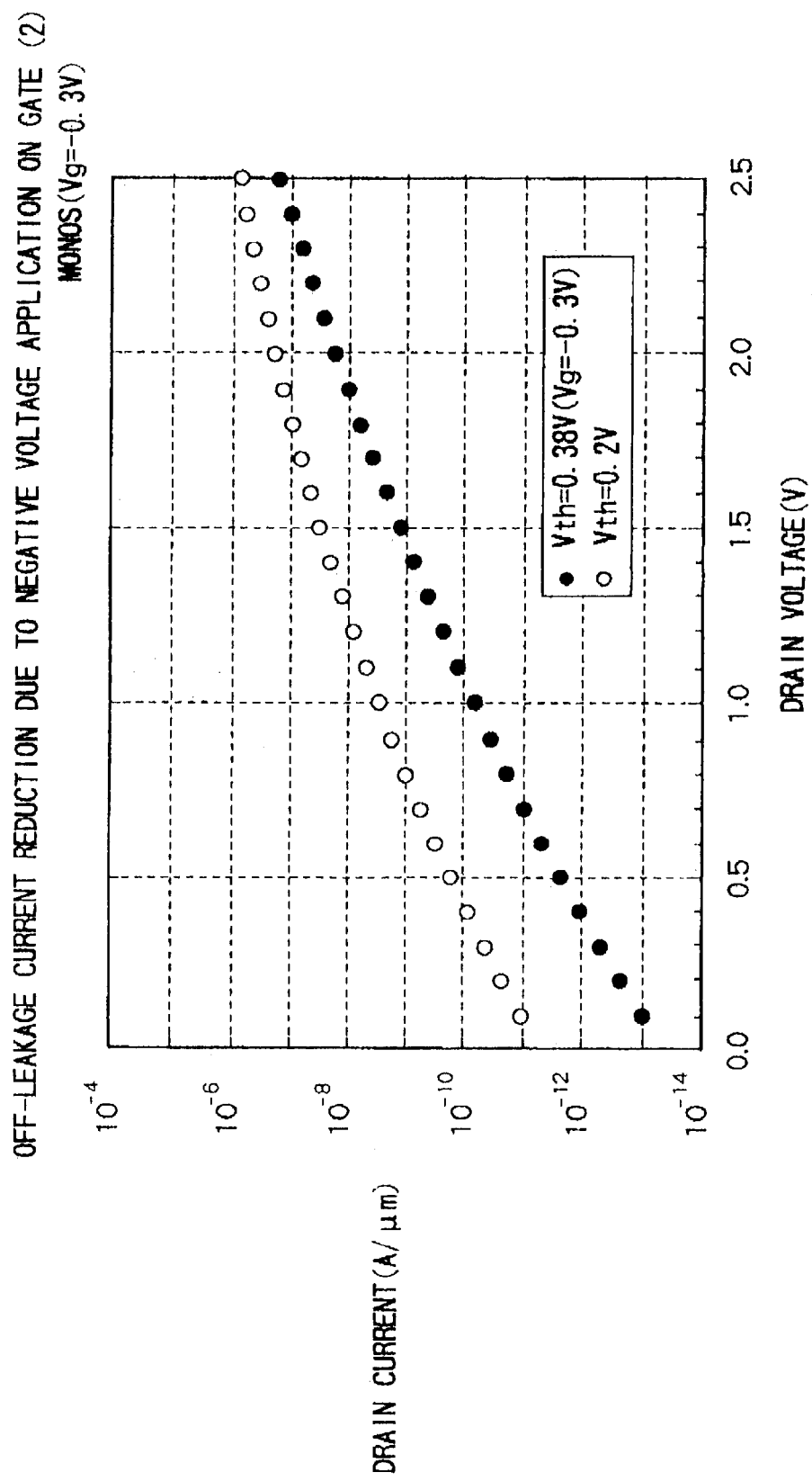
FIG. 6 is a graph of the drain voltage-current characteristic in the case of different threshold voltages of the erase state in a MONOS type memory transistor according to the first embodiment of the present invention.

FIG. 6 shows the leak-current characteristic of a MONOS transistor having a threshold voltage Vth(E) in an erase state of 0.38V and 0.2V when the gate voltage Vg is set to −0.3V.

Even in a MONOS transistor where the threshold voltage Vth(E) in an erase state is a relatively small 0.2V, the leakage current when the drain read voltage is 1.2V is not more than 10 nA/$\mu$m. At this time, since the read current is 50 $\mu$m or more, detection by a sense amplifier is sufficiently possible even if the number of cells in the bit direction is large.

Figure 7:
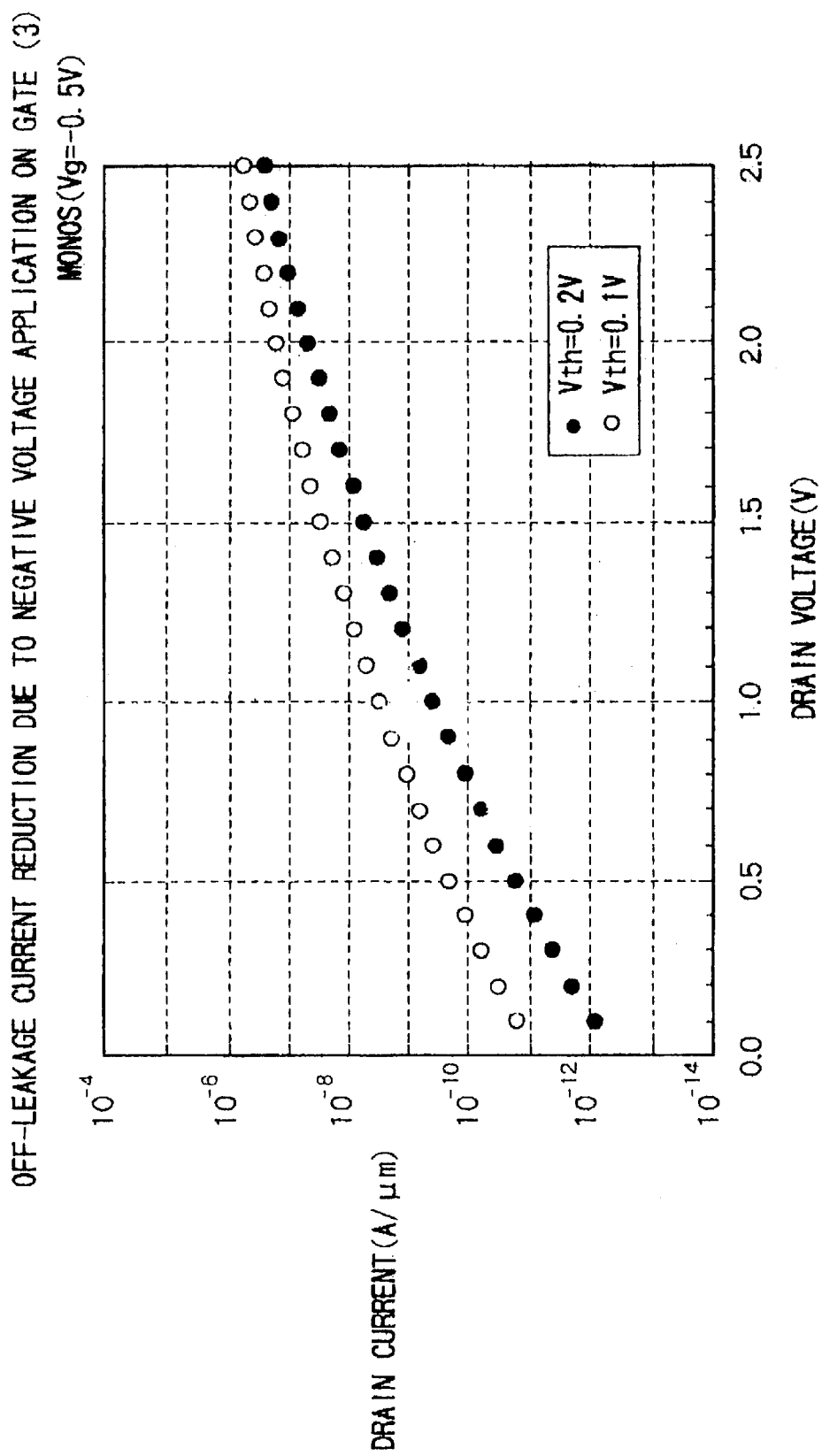
FIG. 7 is a graph of the drain voltage-current characteristic measured at a further lower gate voltage than the case in FIG. 5 in a MONOS type memory transistor according to the first embodiment of the present invention.

FIG. 7 shows the leak-current characteristic of a MONOS transistor having a threshold voltage Vth(E) in an erase state of 0.2V and 0.1V when the gate voltage Vg is set to −0.5V.

Even when the threshold voltage Vth(E) in an erase state is a still smaller 0.1V, the leakage current when the drain read voltage is 1.2V can be suppressed to 10 nA/$\mu$m or less by making the gate voltage Vg −0.5V. Since the read current at this time is 50 $\mu$A/$\mu$m or more, detection by a sense amplifier is sufficiently possible even if the number of cells in the bit direction is large.

From the above, it can be understood that the smaller the threshold voltage Vth(E) in an erase state, the larger the absolute value the gate voltage (forward bias voltage) needs to be. Also, it was confirmed from experiments that the application of a forward bias voltage was sufficient enough to decrease the off-leak current, that is, was not more than 1V in absolute value.

In a MONOS memory transistor where the gate insulating film is made thick, the threshold voltage Vth(E) in an erase state was set to about 0.5V in the related art.

When considering the case where the MONOS memory transistor is selected, however, the larger the read current at a predetermined gate read voltage (for example, 1.5V), the more preferable. Thus, the lower the threshold Vth(E) in an erase state, the more preferable.

Results of the above consideration indicate that the threshold voltage Vth of a memory transistor can be set as low as about 0.2V under the condition that the off-leakage current is suppressed by supplying a negative voltage to the non-selected word lines. Therefore, the read current can be made larger than in the related art under the same gate read voltage, and the SIN ratio of a read signal can be raised.

The method of reading by supplying a negative voltage (forward bias voltage) to the gate when the source potential is 0V is equivalent to a source bias reading method of the related art where the source is biased by a positive voltage and the gate is made 0V in the relative relationship of the potential of the source and the gate.

However, in the source bias reading method of the related art, since the threshold voltages of memory cells in the same row are raised regardless of whether the cells are selected or non-selected, there has been the disadvantage that the read current to be read from the selected cell decreases and the SIN ratio of the read signal cannot be raised.

In the method of reading according to the present embodiment, it is possible to reduce just the off-leakage current of non-selected cells without raising the threshold voltage of the selected cell. Therefore, the reading method of the present embodiment is more effective in raising the S/N ratio of the read signal by increasing the read current comparing with the source bias read method of the related art.

The size of the forward bias voltage is defined by the voltage which can be supplied in relation with the disturb characteristic in a write state of non-selected cells.

Next, the read-disturb characteristic when the gate bias voltage was −0.5V was considered. As a result, the window width of the threshold voltage after 10 years was 0.5V or more. Accordingly, it was confirmed that it is possible to read data after 10 years when the gate bias voltage is –0.5V.

Conversely, the maximum value of the applicable gate bias voltage (forward bias voltage) obtained from the read disturb limit was, although depending on the specifications of the ONO film, about –0.1V when the tunnel insulating film 10 was 2.6 to 3.0 nm.

Due to the above, by applying a forward bias voltage (for example a negative voltage) to the non-selected word lines at the time of a read operation, it became possible to effectively decrease the off-leakage current while maintaining constant or increasing a read current from the selected cell. As a result, the SIN ratio of the read signal can be raised and reliability of operation of the non-volatile semiconductor memory device can be improved.

Note that in non-volatile memory devices, generally, memory cells in a write state and memory cells in an erase state were erased all at once, so there was the problem of excessive erasure where memory cells in an erase state were further erased and thereby become depletion.

In the MONOS type memory transistor according to the present embodiment, however, since the gate insulating film 10 is made to thicker to some extent, the erasure characteristic in an enhancement region is saturated and therefore there is inherent resistance to depletion.

Also, in non-volatile memory devices, there is usually a sequence for leveling the threshold voltages of memory transistors by erasure verification. Thus, it is relatively easy to level the threshold voltages of the memory transistors in an erase state.

The application of a forward bias voltage in the reading method of the present invention is not intended to decrease the leakage current from depleted non-selected memory transistors, but to decrease to a further lower level the off-leakage current of non-selected memory transistors in an off state even at the time of non-gate biasing.

Under conditions where the gate length is made less than 0.13 μm, the applicable voltage is limited, and the memory capacity in the memory cell array increases, since the off-leakage current due to the DIBL effect is cumulatively added for the number of non-selected cells and superimposed on the bit lines in addition to decreasing the read current value, there is a high possibility of the lowering of the S/N ratio of the read signal becoming an increasingly serious problem.

By applying the reading method of the present invention, a memory signal can be accurately read under the conditions described above.

Second Embodiment

The present embodiment relates to a modification of the memory cell structure and cell array structure.

The memory cell and memory cell array according to the present embodiment are a separated source line NOR type wherein bit lines and source lines are made hierarchical.

Figure 8:
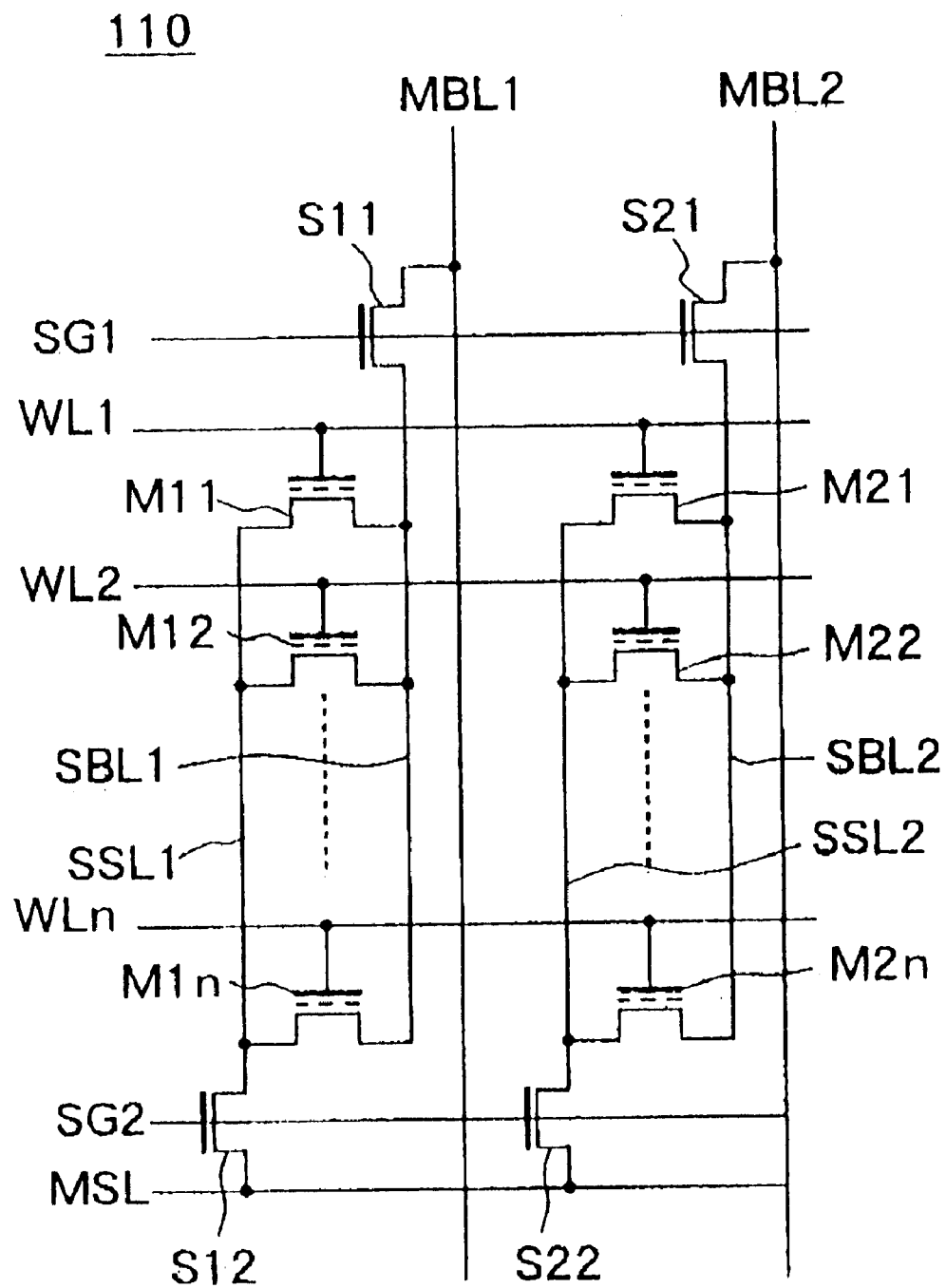
FIG. 8 is a circuit diagram of the circuit configuration of a separated source line NOR type memory cell array according to a second embodiment of the present invention.
Figure 9:
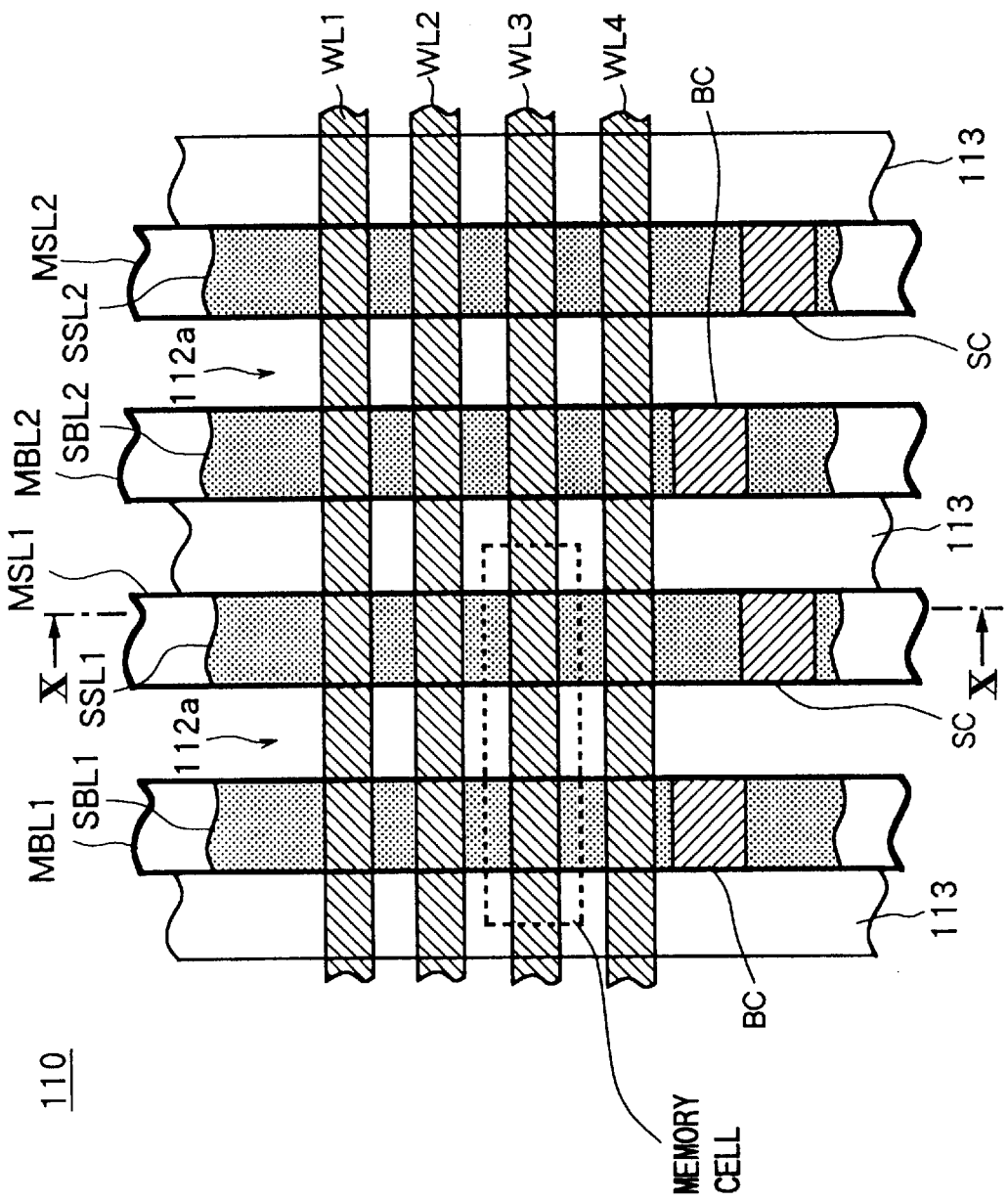
FIG. 9 is a plan view of a pattern example in a separated source line NOR type memory cell array according to the second embodiment of the present invention.
Figure 10:
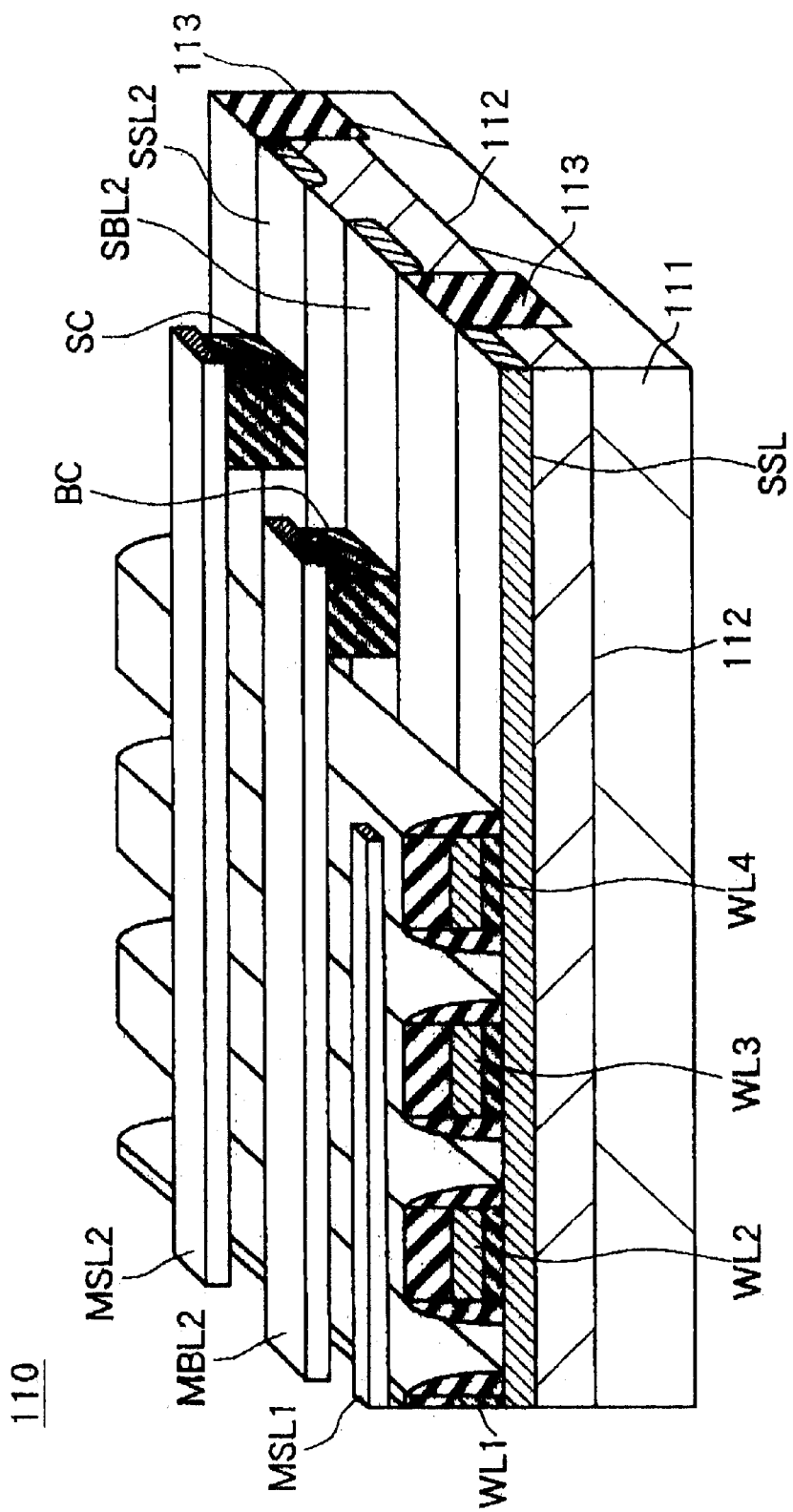
FIG. 10 is a bird's eye view seen from a cross-section taken along the line X—X in FIG. 9 in a separated source line NOR type memory cell array according to the second embodiment of the present invention.

FIG. 8 shows the circuit configuration of a NOR type memory cell array. Also, FIG. 9 is a plan view of a pattern example of a NOR type memory cell array, and FIG. 10 is a bird's eye view seen from a cross-section taken along the line X—X in FIG. 9.

In the non-volatile memory device 110, the bit lines are arranged in a hierarchy of main bit lines and sub bit lines, while source lines are arranged in a hierarchy of main source lines and sub source lines. A main bit line MBLI is connected to a sub bit line SBLI via a selection transistor S11, while a main bit line MBL2 is connected to a sub bit line SBL2 via a selection transistor S21. Also, a main source line MSL (divided to MSL1 and MSL2 in FIG. 10) is connected to a sub source line SSL1 via a selection transistor S12 and to a sub source line SSL2 via a selection transistor S22.

Between the sub bit line SBL1 and sub source line SSL1 are connected memory transistors M11 to M1n in parallel, while between the sub bit line SBL2 and the sub source line SSL2 are connected memory transistors M21 to M2n in parallel. The (n) number of memory transistors connected in parallel and two selection transistors (S11 and S12, or S21 and S22) comprise a unit block of a memory cell array.

The gates of the adjacent memory transistors M11, M21, . . . in the word direction are connected to a word line WL1. In the same way, the gates of the memory transistors M12, M22, . . . are connected to the word line WL2, while the gates of the memory transistors M1n, M2n, . . . are connected to a word line WLn.

The selection transistors S11, S21, . . . adjacent in the word direction are controlled by a selection line SG1, while the selection transistors S12, S22, . . . are controlled by a selection line SG2.

In the NOR type cell array 110, as shown in FIG. 10, a p-well 112 is formed in the surface region of the semiconductor substrate 111. The p-well 112 is insulated and separated in the word line direction by element separation insulating layer 113 formed by burying an insulation material in a trench and is arranged in parallel stripes.

The p-well portions separated by the element separation insulating layer 112 become active regions of the memory transistor. On the two sides of the active region in the width direction, n-type impurities are doped at a high concentration in parallel stripes at certain distances from each other, whereby the sub bit line SBL and the sub source line SSL are formed.

The word lines WL1, WL2, WL3, WL4 . . . are arranged at regular intervals perpendicularly intersecting the sub bit lines SBL and sub source lines SSL via an insulating film. The word lines are, as will be explained later on, configured by stacking a gate insulating film comprised by a tunnel insulating film, nitride film, and top insulating film and a gate electrode.

The intersecting portion of a p-well portion 112 between sub bit line SBL and sub source line SSL with a word line becomes a channel-forming region of the memory transistor. The sub bit line portion in contact with the channel-forming region functions as a drain, while the sub source line portion functions as a source.

The top portions and the side walls of the word lines are, in the same way as the case in FIG. 3, covered with offset insulating layers and side wall insulating layers (normal interlayer insulating layer may be applied in the present embodiment).

These insulating layers are formed with bit contact plugs BC reaching the sub bit lines SBL and source contact plugs SC reaching the sub source lines SSL at predetermined intervals. These plugs BC and SC are provided for every 128 memory transistors in the bit line direction.

Also, on the insulating layer is formed main bit lines MBL1, BL2, . . . contacting the bit contact plugs BC and main source lines MSL1, SL2 contacting the source contact plugs BC alternately in a parallel stripe shape.

The miniature NOR type cell array 110 has bit lines and source lines arranged in a hierarchy. It is not necessary to form the bit contact plug BC and source contact plug SC for each memory cell. Accordingly, there is basically no variation in the contact resistance itself. A bit contact plug BC and source contact plug SC are provided for example for every 128 memory cells, but when the plugs are not formed by self alignment, the offset insulating layer and side wall insulating layer are not necessary. Namely, it is enough to thickly deposit an ordinary interlayer insulating film to bury the memory transistors.

As explained above, in the present embodiment, there is the advantage that the process can be further simplified.

Also, since there is almost no wasted space as the pseudo contact-less structure where sub interconnections (sub bit lines and sub source lines) are comprised by an impurity region, when the layers are formed at a minimum line width F of the wafer process limit, production is possible with a very small cell area close to $8F^2$.

Furthermore, since the bit lines and source lines are arranged in a hierarchy and the selection transistor S11 or S21 separates a parallel main transistor group in non-selected unit block from the main bit line MBL1 or MBL2, the load-capacitance of the main bit line is remarkably reduced which results in advantages of a higher speed and lower power consumption. Also, due to the action of the selection transistor S12 or S22, it is possible to separate the sub source lines from the main source lines and lower the load-capacitance.

Note that it is preferable for a higher speed to form the sub bit lines SBL1 and SBL2 or sub source lines SSL1 and SSL2 in an impurity region being bonded with a silicide and to use metal interconnections for the main bit lines MBL1 and MBL2.

In the same way as in the first embodiment, by supplying a forward bias voltage (for example a negative voltage) to non-selected word lines at the time of a read operation, it becomes possible to effectively reduce an off-leakage current from the non-selected cells while securing or increasing a certain amount of read current from the selected cell. As a result, the S/N ratio of a read signal can be made higher and the reliability of operation of the non-volatile semiconductor memory device can be improved.

Third Embodiment

The present embodiment relates to a non-volatile semiconductor memory device using as charge storing means of memory transistors a plurality of Si-nano crystals buried in a gate insulating film, having a particle size of for example 10 nm or less, and mutually insulated from each other (hereinafter referred to as a Si-nano crystal type).

Figure 11:
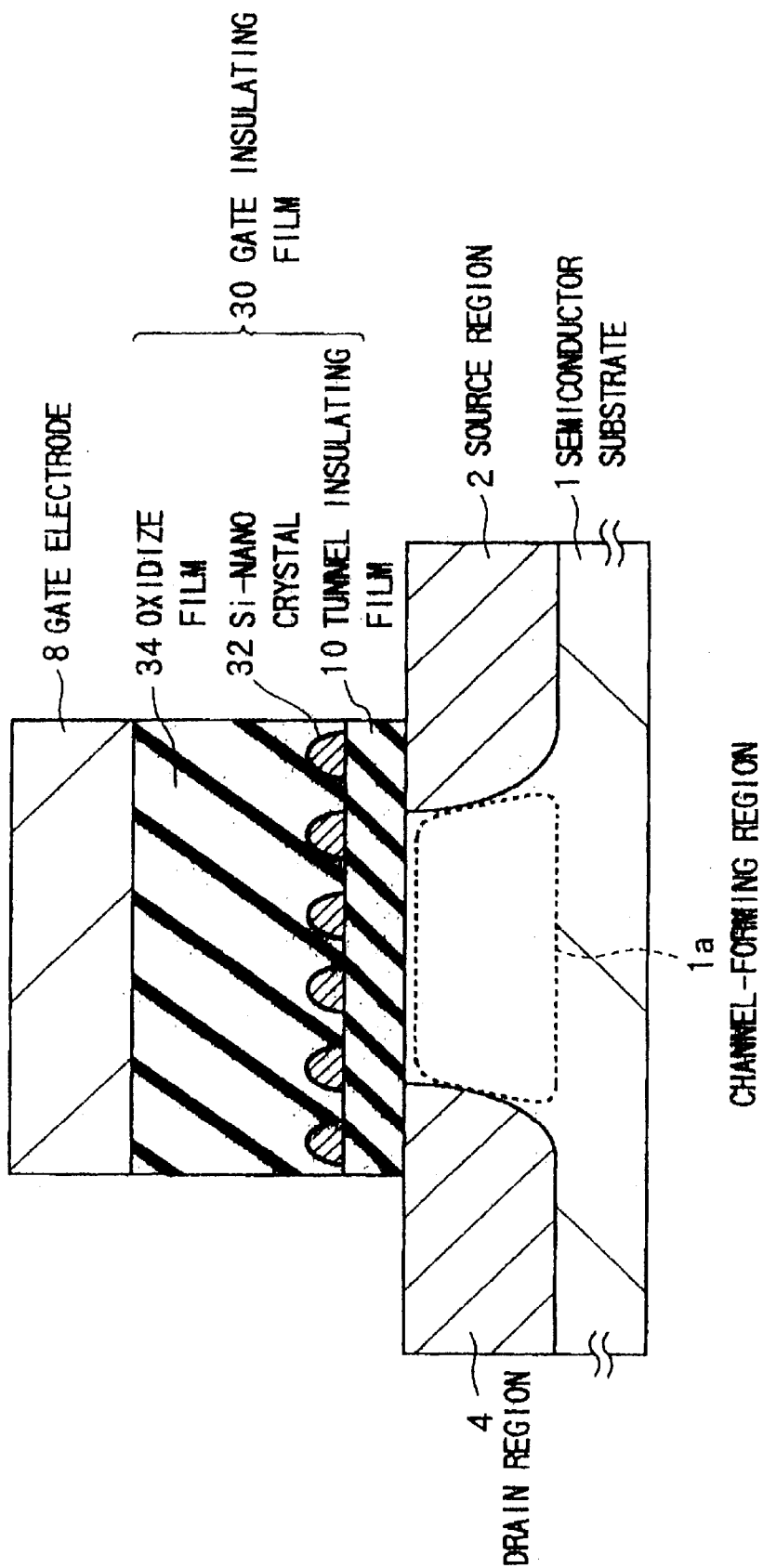
FIG. 11 is a sectional view of an element structure of a Si-nanocrystal type memory transistor according to a third embodiment of the present invention.

FIG. 11 is a sectional view of the element configuration of an Si-nano crystal type memory transistor.

The Si-nano crystal non-volatile memory is different from the first embodiment in the points that a gate insulating film 30 of the present embodiment takes the place of the nitride film 12 and the top insulating film 14 and that Si-nano crystals 32 serving as dispersed charge storing means on the tunnel insulating film 10 and an oxide film 34 thereon are formed between gate electrodes 8.

The rest of the configuration, that is, the semiconductor substrate 1, channel-forming region 1a, source region 2, drain region 4, tunnel insulating film 10, and gate electrode 8, are the same as those in the first embodiment.

A Si-nano crystal 32 has a size (diameter) of preferably 10 nm or less, for example, about 4.0 nm. Si-nanocrystals are spatially separated by the oxide film 34 at intervals of for example 4 nm.

The tunnel insulating film 10 in the present embodiment is a little thicker than in the first embodiment due to the charge storing means (Si-nano crystals 32) being close to the substrate side. The thickness can be suitably selected within the range from 2.6 nm to 5.0 nm in accordance with the application of use. Here, the film thickness was made about 3.5 nm.

In the production of a memory transistor configured as such, after forming the tunnel insulating film 10, a plurality of Si-nano crystal 32 are formed on the tunnel oxide film 10 for example by the CVD method. Also, the oxide film 34 is formed for example to about 7 nm by LPCVD so as to bury the Si-nano crystals 32. In LP-CVD, it is assumed that the material gas is a mixed gas of dichlorosilane (DCS) and $N_2O$ and the substrate temperature is for example 700° C. At this time, the Si-nano crystals 32 are buried in the oxide film 34 and the surface of the oxide film is made to flat. When it does not become sufficiently flat, it is preferable to newly perform a flattening process (for example, chemical mechanical polishing (CMP)). Next, steps of forming the gate electrodes 8 and patterning the gate laminated films 10, 34 and 8 all at once are performed to complete the Si-nano crystal type memory transistor.

The Si-nano crystals 32 formed as such function as carrier traps made disperse in the planar direction. The trap level can be estimated by a band discontinuity with the surrounding silicon oxide. The estimated value is about 3.1 eV. Si-nano crystals 32 of such a size can hold several injected electrons. Note that the Si-nano crystals 32 may be made further smaller and hold single electron.

An Si-nanocrystal type non-volatile memory configured as such was examined as to its data holding characteristic by a Lundkvist's back-tunneling model. It is important to widen the trap level and to make the distance between the center of distribution (or centroide) of charges and a semiconductor substrate 1 longer. Thus, data retention in the case of a trap level of 3.1 eV was examined by a simulation using the Lundkvist's model as a physical model. As a result, it was found that preferable data retention was shown by using deep carrier traps of a trap level 3.1 eV even when the distance from a charge holding medium to the channel-forming region la is a relatively short about 4.0 nm.

In the same way as in the first embodiment, by supplying a forward bias voltage (for example a negative voltage) to non-selected word lines at the time of a read operation, it became possible to effectively reduce an off-leakage current from non-selected cells while securing a certain amount or increasing a read current from a selected cell. As a result, the S/N ratio of a read signal can be increased and the reliability of operation of the Si-nanocrystal type non-volatile semiconductor memory device can be improved.

Fourth Embodiment

The present embodiment relates to a non-volatile memory device using a large number of fine divided type floating gates buried in an insulating layer as dispersed charge storing means of a memory transistor (hereinafter referred to as a fine divided FG type).

FIG. 12 is a sectional view of the element configuration of a fine divided FG type memory transistor.

The fine divided FG type non-volatile memory of the present embodiment differs from the above first embodiment in that the memory transistors are formed on a SOI substrate and that, instead of the nitride film 12 and the top insulating film 14, the gate insulating film 40 of the present embodiment is comprised of a fine divided floating gate 42 as a dispersed charge storing means on the tunnel insulating layer 10 and an oxide film 44 on the same formed under the gate electrodes 8.

In the rest of the configuration, the tunnel insulating film 10 and gate electrode 8 are the same as in the first embodiment.

The fine divided floating gate 42, together with the Si-nano crystals 32 of the third embodiment, corresponds to a specific example of a "fine particle conductor" mentioned in the present invention.

As the SOI substrate, a separation by implantation oxygen (SIMOX) substrate wherein oxygen ions are injected in a silicon substrate at high concentration by ion implantation and a buried oxide film is formed at a deeper position than the substrate surface or a bonded substrate wherein an oxide film is formed on the surface of one silicon substrate and bonded to another substrate may be used. The SOI substrate shown in FIG. 12 formed by the above method is comprised of a semiconductor substrate 46, separation oxide film 48, and silicon layer 50, wherein the silicon layer 50 is comprised of a channel-forming region 50a, source region 2, and drain region 4.

Note that a glass substrate, plastic substrate, sapphire substrate, etc. may be used instead of a semiconductor substrate 46.

The fine divided floating gates 42 are obtained by processing a normal FG type floating gate to fine poly-Si dots having heights of for example about 5.0 nm and diameters of for example up to 8 nm.

The tunnel insulating film 10 in the present embodiment is a little thicker than that in the first embodiment, but is formed much thinner compared with a normal FG type and can be suitably selected within the range of 2.5 nm to 4.0 nm in accordance with the application of use. Here, it is made a thickness of 3.0 nm.

In the production of a memory transistor configured as above, a tunnel insulating film 10 is formed on the SOI substrate, then a polycrystalline silicon film (final thickness: 5 nm) is formed on the tunnel insulating film 10 by for example LP-CVD. In the LP-CVD, the material gas is made a mixed gas of DCS and ammonia and the substrate temperature is made for example 650° C. Next, the polycrystalline silicon film is processed to fine poly-Si dots having a diameter of for example 8 nm or less by using for example electron beam exposure. The poly-Si dots function as a fine divided type floating gate 42 (dispersed charge storing means). Next, an oxide film 44 of for example 9 nm is formed by LP-CVD so as to bury the fine divided type floating gates 42. In the LP-CVD, the material gas is made a mixed gas of DCS and $N_2O$ and the substrate temperature is made for example 700° C. At this time, the fine divided type floating gates 42 are buried in the oxide film 44 and the surface of the oxide film 44 is flattened. When it does not become sufficiently flat, it is preferable to newly perform a flattening process (for example, CMP). Next, steps of forming the gate electrodes 8 and patterning the gate laminated films 8, 44 and 10 all at once are performed to complete the fine divided FG type memory transistor.

A device was fabricated using an SOI substrate in this way and finely dividing the floating gate. Its characteristics were evaluated. As a result, it was confirmed that, as expected, good characteristics could be obtained.

In the same way as in the first embodiment, by supplying a forward bias voltage (for example, a negative voltage) to the non-selected word lines at the time of a read operation, it becomes possible to effectively reduce an off-leakage current from the non-selected cells while increasing or securing a certain amount of a read current from the selected cell. As a result, the S/N ratio of the read signal can be increased and the reliability of operation of a fine divided FG type non-volatile semiconductor memory device can be improved.

Modifications

Various modifications can be made to the above first to fourth embodiments.

While not specifically illustrated, the present invention can also be applied to a divided bit line NOR (DINOR) type, a so-called high capacitive-coupling ratio (HiCR) type or fine NOR type cell comprising a cell array of a separated source line type wherein source lines are commonly used by two adjacent source regions.

"Charge storing means made to be dispersed" in the present invention includes carrier traps of a nitride film bulk and carrier traps formed near an interface of an oxide film and nitride film, so the present invention can be applied even to an MNOS type wherein the gate insulating film is a nitride-oxide (NO) film.

The present invention can also be applied to an embedded type non-volatile memory formed on the same substrate as a logic circuit in addition to a stand-alone type non-volatile memory.

Note that use of an SOI substrate like in the fourth embodiment can be simultaneously applied with the configurations of the memory transistors of the first to third embodiments.

Summarizing the effects of the present invention, according to a reading method of a non-volatile semiconductor memory device of the present invention, by supplying a forward bias voltage (for example a negative voltage) to non-selected word lines at the time of a read operation, it becomes possible to effectively reduce an off-leakage current from the non-selected cells while increasing or securing a certain amount of read current from the selected cell. As a result, the S/N ratio of a read signal can be increased and the reliability of operation of the non-volatile semiconductor memory device can be improved.

Furthermore, in terms of suppressing reading disturb, it is possible to use at the same time a so-called source bias reading method wherein a reverse bias voltage is supplied to the selected source line. In this case, even if an absolute value of the forward bias voltage is decreased while suppressing a decrease of the read current from the selected cell to a minimum, it becomes possible to sufficiently reduce an off-leakage current from non-selected cells.

A non-volatile semiconductor memory device according to the present invention comprises a means for supplying the above forward bias voltage and reverse bias voltage. The above reading method can be easily applied.

While the invention has been described with reference to specific embodiment chosen for purpose of illustration, it should be apparent that numerous modifications could be made thereto by those skilled in the art without departing from the basic concept and scope of the invention.

What is claimed is:

1. A non-volatile semiconductor memory device comprised of a plurality of memory transistors, each comprising a source region and a drain region formed sandwiching a channel-forming region at a surface portion of a semiconductor, a gate insulating film provided on the channel-forming region and including therein a charge storing means, and a gate electrode on the gate insulating film, arranged in a word direction and a bit direction, said non-volatile semiconductor memory device further comprising a forward bias voltage supply means for supplying a forward bias voltage of a value to reduce an off-leakage current in the forward bias direction with respect to the channel-forming region to the gate electrodes of non-selected memory transistors among the above plurality of memory transistors at the time of a read operation.

2. A non-volatile semiconductor memory device as set forth in claim 1, wherein said forward bias voltage is set within a voltage region where said non-selected memory transistors are not read erroneously.

3. A non-volatile semiconductor memory device as set forth in claim 1, wherein an absolute value of said forward bias voltage is not more than 1V.

4. A non-volatile semiconductor memory device as set forth in claim 1, further comprising a reverse bias voltage supply means for supplying a reverse bias voltage to reversely bias said source regions of non-selected memory transistors with respect to said channel-forming region at the time of a read operation.

5. A non-volatile semiconductor memory device as set forth in claim 1, wherein a gate length of said memory transistor is not more than 0.13 $\mu$m.

6. A non-volatile semiconductor memory device as set forth in claim 1, wherein said memory transistor has a threshold voltage of at least 0V in its erase state.

7. A non-volatile semiconductor memory device as set forth in claim 1, wherein:
  further provision is made of a plurality of word lines and a plurality of common lines in the bit direction intersecting the plurality of word lines in an electrically insulated state;
  a plurality of gate electrodes are connected to the plurality of word lines; and
  a plurality of said source regions or drain regions are coupled to said plurality of common lines.

8. A non-volatile semiconductor memory device as set forth in claim 7, comprising:
  a word line for commonly connecting said gate electrodes in the word direction;
  a source line for commonly connecting said source regions in the bit direction; and
  a bit line for commonly connecting said drain regions in the bit direction.

9. A non-volatile semiconductor memory device as set forth in claim 8, wherein
  said source line comprises a sub source line for commonly connecting said source regions in the bit direction and a main source line for commonly connecting sub source lines in the bit direction; and
  said bit line comprises a sub bit line commonly connecting said drain regions in the bit direction and a main bit line for commonly connecting sub bit lines in the bit direction.

10. A non-volatile semiconductor memory device as set forth in claim 1, wherein said charge storing means is made to be dispersed at least in a surface direction facing said channel-forming region.

11. A non-volatile semiconductor memory device as set forth in claim 1, wherein said charge storing means does not have conductivity over an entire surface direction facing said channel-forming region at least when charges do not dissipate outside.

12. A non-volatile semiconductor memory device as set forth in claim 11, wherein said gate insulating film includes a tunnel insulating film on said channel-forming region and a nitride film or an oxynitride film on the tunnel insulating film.

13. A non-volatile semiconductor memory device as set forth in claim 11, wherein said gate insulating film includes a tunnel insulating film and mutually insulated fine particle conductors formed on the tunnel insulating film as the above charge storing means.

14. A non-volatile semiconductor memory device as set forth in claim 13, wherein said fine particle conductor has a particle diameter of not more than 10 nm.

15. A method of reading a non-volatile semiconductor memory device comprised of a plurality of memory transistors, each comprising a source region and drain region formed sandwiching a channel-forming region at a surface portion of a semiconductor, a gate insulating film provided on the channel-forming region and including therein a charge storing means, and a gate electrode on the gate insulating film, arranged in. a word direction and a bit direction,
  said method of reading a non-volatile semiconductor memory device comprising supplying to the gate electrodes of non-selected memory transistors among the above plurality of memory transistors a forward bias voltage of a value to reduce an off-leakage current in the forward bias direction with respect to the channel-forming region at the time of a read operation.

16. A method of reading a non-volatile semiconductor memory device as set forth in claim 15, further comprising setting said forward bias voltage to be within a voltage region where said non-selected memory transistors are not read out erroneously.

17. A method of reading a non-volatile semiconductor memory device as set forth in claim 15, wherein said forward bias voltage is not more than 1V in absolute value.

18. A method of reading a non-volatile semiconductor memory device as set forth in claim 15, further comprises supplying a reverse bias voltage to reversely bias said source region of non-selected memory transistors with respect to said channel-forming region at the time of a read operation.

19. A method of reading a non-volatile semiconductor memory device as set forth in claim 15, wherein said memory transistor has a gate length of not more than 0.13 $\mu$m.

20. A method of reading a non-volatile semiconductor memory device as set forth in claim 15, wherein said memory transistor has a threshold voltage of 0V or more in its erase state.

21. A method of reading a non-volatile semiconductor memory device as set forth in claim 15, wherein said non-volatile semiconductor device further comprises: a plurality of word lines and a plurality of common lines in the bit direction intersecting the plurality of word lines in an electrically insulated state,
  wherein said plurality of word lines are connected to a plurality of said gate electrodes; and
  wherein said plurality of common lines are coupled to a plurality of said source regions or drain regions.

22. A method of reading a non-volatile semiconductor memory device as set forth in claim 21, wherein said non-volatile semiconductor device comprises:
  a word line for commonly connecting said gate electrodes in the word direction;
  a source line for commonly connecting said source regions in the bit direction; and
  a bit line for commonly connecting said drain regions in the bit direction.

23. A method of reading a non-volatile semiconductor memory device as set forth in claim 22, wherein:

said source line comprises a sub source line for commonly connecting said source regions in the bit direction and a main source line for commonly connecting sub source lines in the bit direction; and said bit line comprises a sub bit line commonly connecting said drain regions in the bit direction and a main bit line for commonly connecting sub bit lines in the bit direction.

24. A method of reading a non-volatile semiconductor memory device as set forth in claim 15, wherein said charge storing means is made to be dispersed at least in a surface direction facing said channel-forming region.

25. A method of reading a non-volatile semiconductor memory device as set forth in claim 15, wherein said charge storing means does not have conductivity over an entire surface direction facing said channel-forming region at least when charges do not dissipate outside.

26. A method of reading a non-volatile semiconductor memory device as set forth in claim 25, wherein said gate insulating film includes:

a tunnel insulating film on said channel-forming region; and a nitride film or an oxynitride film on the tunnel insulating film.

27. A method of reading a method of reading a nonvolatile semiconductor memory device as set forth in claim 25, wherein said gate insulating film includes:

a tunnel insulating film on said channel-forming region; and mutually insulated fine particle conductors formed on the tunnel insulating film as the above charge storing means.

28. A method of reading a non-volatile semiconductor memory device as set forth in claim 27, wherein said fine particle conductors have a particle diameter of not more than 10 nm.

* * * * *